United States Patent [19]

Kausov

[11] 3,945,029

[45] Mar. 16, 1976

[54] SEMICONDUCTOR DIODE WITH LAYERS OF DIFFERENT BUT RELATED RESISTIVITIES

[76] Inventor: Sergei Fedorovich Kausov, Scherbakovskaya ulitsa, 57/20, kv. 178, Moscow, U.S.S.R.

[22] Filed: Mar. 19, 1974

[21] Appl. No.: 453,003

[52] U.S. Cl. .................. 357/14; 357/20; 357/88; 357/89
[51] Int. Cl.² ........................................ H01L 29/92
[58] Field of Search .............. 357/13, 14, 20, 88, 89

[56] References Cited
UNITED STATES PATENTS

| | | | |
|---|---|---|---|
| 3,553,539 | 1/1971 | Nakashima et al. | 357/13 |
| 3,555,373 | 1/1971 | Kawana et al. | 357/13 |
| 3,663,874 | 5/1972 | Fukukawa | 357/13 |
| 3,764,415 | 10/1973 | Raabe et al. | 357/14 |

*Primary Examiner*—Andrew J. James
*Attorney, Agent, or Firm*—Haseltine, Lake & Waters

[57] ABSTRACT

The semiconductor junction of a diode is made up of p- and n-type layers, said layers having substantially different resistivities. The thickness of the layer with a greater resistivity does not exceed that of the space charge when a reverse bias voltage, which is less than the puncture voltage of the semiconductor junction, is applied to the structure. The minimum distance between the edge of the ohmic contact adjoining the layer with a greater resistivity and the place of emergence of the semiconductor junction to the surface of the structure is no less than the double thickness of the layer with a greater resistivity.

6 Claims, 3 Drawing Figures

SEMICONDUCTOR DIODE WITH LAYERS OF DIFFERENT BUT RELATED RESISTIVITIES

The present invention relates to semiconductor instruments and, more particularly, to semiconductor diodes.

At present, extensive use is made of semiconductor diodes having a two-layer structure. This structure is formed by two layers of oppostie types of conductivity, normally p- and n-type layers, which make up a p-n semiconductor junction. The resistivity of one of said layers is 100 and even more times greater than that of the other layer, the layer with a greater resistivity having a relatively small thickness, the area of the ohmic contact adjacent the layer with a greater resistivity being roughly equal to that of the p-n junction.

As a result, at the place of its emergence to the surface of the structure, the semiconductor junction finds itself in immediate proximity to the ohmic contact adjoining the layer with a greater specific resistance. This accounts for great leakage currents and may also be the cause of a puncture of the semiconductor junction over the surface of the semiconductor. The ratio minimal to maximal capacitance in such diodes is extremely low and only approximates 4 to 5 units.

It is an object of the present invention to raise the operational reliability of semiconductor diodes by reducing leakage currents and minimizing the chances of puncture.

It is another object of the present invention to improve the minimal to maximal capacitance ratio of such diodes.

With the above and other objects in view, the present invention contemplates a semiconductor diode comprising a semiconductor structure having layers of opposite types of conductivity provided with ohmic contacts, said layers making up a semiconductor junction therebetween and having substantially different resistivity. In accordance with the invention, the thickness of the layer with a greater resistivity does not exceed, over the portion adjoining the ohmic contact, the thickness of the space charge when there is applied to the ohmic contacts a reverse bias voltage which is less than the puncture voltage of said semiconductor junction, the minimum distance between the edge of the ohmic contact adjoining the layer with a greater resistivity and the area of emergence of the semiconductor junction to the surface of the structure being no less than the double thickness of the layer having a greater resistivity.

The proposed semiconductor-diode structure provides for reliable operation, which is due to the above-indicated thickness of the semiconductor layer with greater resistivity and an increased distance between the ohmic contact thereof and the area of emergence of the semiconductor junction at the surface of the structure, as this substantially reduces the intensity of the electric field at the surface of the structure compared to that inside the structure.

It is preferred that the area of the ohmic contact adjoining the layer with a greater resistivity should not exceed half the area of the semiconductor junction.

The above ratio between the areas of the ohmic contact and the semiconductor junction accounts for a high minimal to maximal capacitance ratio.

The layer with a lesser resistivity may envelop that with a greater resistivity, forming a semiconductor junction that emerges to the surface of the structure on the side of the ohmic contact adjoining the layer with a greater resistivity, which ensures protection of said junction from the effects of the surrounding medium.

The invention will hereinafter be explained in greater detail with reference to specific embodiments thereof taken in conjunction with the accompanying drawings, wherein.

Figure 1:
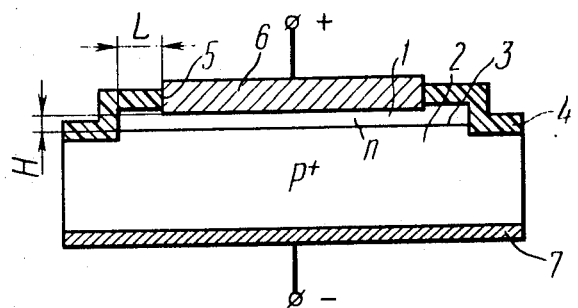
FIG. 1 is a view in section of a semiconductor diode, wherein the p-n junction emerges to the lateral surface.

The semiconductor structure of the proposed diode is formed by two layers 1 and 2 of the n- and p-types, respectively. The resistivity of the layer 1 has to be at least 100 times greater than that of the layer 2. The layers 1 and 2 make up a p-n junction 3 emerging to the lateral surface of the structure.

The choice of the ratio between the values of the resistivity of the layers 1 and 2 is determined by the purpose of the semiconductor diode.

For high-voltage diodes, for example, this ratio is selected to be equal to or in excess of 1,000; accordingly, this presupposes a greater thickness of the layer 1, which provides for an increased puncture voltage of the semiconductor junction both inside the structure and over the area of its emergence to the surface. On the side of the layer 1, the surface of the semiconductor structure is protected by a dielectric layer 4 having a window 5 housing an ohmic contact 6.

The thickness (H) of the semiconductor layer 1 with a greater resistivity over the portion under the ohmic contact is selected to be equal to the thickness of the space charge area at a voltage less than the puncture voltage of the structure.

The width of the space charge area and the puncture voltage are selected depending upon the concentration and distribution of the impurity over the p-n junction, with the aid of the commonly known formulas.

The minimum distance (L) between the edge of the ohmic contact 6 adjacent the layer with a greater resistivity and the place of the emergence of the semiconditor junction 3 to the surface of the structure is to be no less than two times the thickness of the layer with a greater resistivity below said ohmic contact.

The area of the ohmic contact 6 amounts to one half of that of the semiconductor junction 3. Further increase in the area of the ohmic contact 6 is impractical, as it sharply raises the minimal to maximal capacitance ratio. The semiconductor layer 2 is provided with an ohmic contact 7. The proposed diode may be produced as follows. First, an epitaxial silicon p-type layer with a thickness of 5 m$\mu$ and a specific resistance of 20 to 50 o/cm is grown on the semiconductor surface of an silicon n-type plate with a specific resistance of less than 0.01 o/cm. Then, with the aid of photolithography and chemical etching, projections with a diameter of 400 m$\mu$ and a height of 6 m$\mu$ are produced on the plate on the side of the epitaxial layer. This is followed by growing a silicon dioxide film at a temperature of 1,000° to 1,150°C and making windows with a diameter of 200 m$\mu$. In order to obtain an ohmic contact, a single diffusion of boron is effected to a depth of 0.5 m$\mu$ and a vacuum deposition of aluminum with subsequent annealing at a temperature of 550°C. The plate is then divided into separate crystals, each to be installed in a metal housing.

With a reverse bias voltage applied to such a diode, the area of the space charge tends to expand primarily towards the layer 1 having a greater specific resistance.

As this takes place, the width of the space charge area on the surface of the structure is found to be equal to a minimum distance between the edge of the ohmic contact 6 and the place of the emergence to the surface of the semiconductor junction 3, which reduces at least two-fold the intensity of the electric field at the surface of the structure in relation to that inside the semiconductor. This also reduces the leakage current and rules out the chance of a puncture on the surface of the structure.

Figure 2:
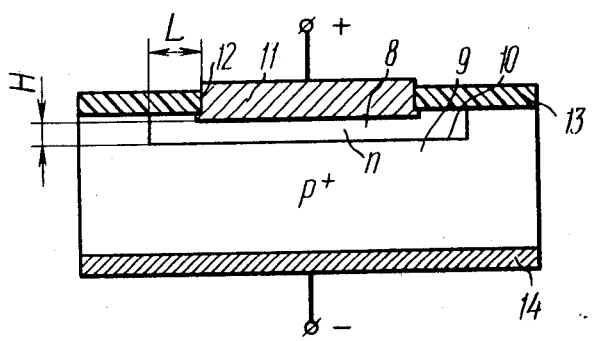
FIG. 2 shows a semiconductor diode, wherein the p-n junction emerges to the end face surface thereof, on the side of the ohmic contact.
Figure 3:
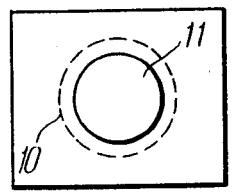
FIG. 3 is a top view of FIG. 2.

FIG. 2 illustrates another embodiment of the invention. The semiconductor structure comprises two layers 8 and 9 of the n and p types, respectively. The specific resistance of the layer 8 is at least 100 times greater than that of the layer 9. The layer 9, which has a lesser resistivity, envelops the layer 8 with a greater resistivity, and a p-n junction 10 formed by these two layers emerges to the surface of the structure on the side of an ohmic contact 11 which adjoins the layer having a greater resistivity. Said contact 10 is disposed in a window 12 of a protective dielectric layer 13. The ohmic contact 11 is arranged concentrically (FIG. 3) with respect to the configuration of the semiconductor junction 10 at the place where it emerges at the surface of the structure, the area of said ohmic contact being at least four times less than that of the p-n junction.

The layer 9 (FIG. 2) is provided with an ohmic contact 14. The values of H and L are selected as described hereinabove.

The above diode operates in a manner similar to that of the diode of FIG. 1. The advantage of this diode resides in a better protection of the p-n junction.

The proposed diodes provide for higher puncture voltages and a higher minimal to maximal capacitance ratio.

What is claimed is:

1. A semiconductor diode comprising two layers of opposite types of conductivity constituting a semiconductor structure, said layers forming a semiconductor junction therebetween and having substantially different resistivity, the layer with greater resistivity having a thickness no greater than that of the space charge produced as a result of application to said structure of a reverse bias voltage which is less than the puncture voltage of said semiconductor junction, ohmic contacts respectively adjoining said layers and adapted to apply supply voltage to said structure, said ohmic contacts having respective edges, said semiconductor junction emerging at the surface of said structure, the ohmic contact adjacent the layer with greater resistivity being arranged so that the distance between its edge and the place of emergence of the semiconductor junction at the surface of the structure is no less than two times the thickness of the layer with a greater resistivity.

2. A semiconductor diode as claimed in claim 1, wherein the area of the ohmic contact adjacent the layer with greater resistivity does not exceed one half of the area of the semiconductor junction.

3. A semiconductor diode as claimed in claim 1, wherein the layer with lesser resistivity at least partly envelops that with greater resistivity, forming a semiconductor junction which emerges at the surface of the structure on the side of the ohmic contact adjacent the layer with greater resistivity.

4. A semiconductor diode as claimed in claim 3, wherein the ohmic contact adjacent the layer with greater resistivity is arranged concentrically with respect to the semiconductor junction at the place where it emerges at the surface of the structure, the area of said ohmic contact being at least two times less than that of the semiconductor junction.

5. A semiconductor P-N type junction construction comprising: two semiconductor layers of opposite types of conductivity, ohmic contacts on said layers, said layers forming a P-N junction and having different resistivity values, the thickness of the layer with a greater resistivity not exceeding that of the region of the space charge produced as a result of application to said construction of a reverse bias voltage which is lower than the puncture voltage of said P-N junction; the ohmic contact attached to the layer having a greater resistivity and having an area smaller than that of the P-N junction; the latter said ohmic contact being so disposed that the distance from its edges to the place where the P-N junction emerges on the surface of the semiconductor construction is at least twice as large as the thickness of the layer with a greater resistivity.

6. A semiconductor P-N type junction construction as claimed in claim 5, wherein the resistivity of the semiconductor layer having a smaller resistivity is within the range of from 0.001 to 0.01 ohm.cm., while that of the layer having a greater resistivity is from 1 to 50 ohm.cm.

* * * * *